(12) United States Patent
Kim et al.

(10) Patent No.: US 6,501,336 B2
(45) Date of Patent: Dec. 31, 2002

(54) SELF-CALIBRATION DEVICE AND METHOD FOR CALIBRATING PHASE OFFSET BETWEEN OUTPUT WAVEFORMS OF RING OSCILIATOR

(75) Inventors: Beomsup Kim, Taejon (KR); Chan-Hong Park, Seoul (KR)

(73) Assignee: Korea Advanced Institute of Science and Technology, Taejon (KR)

( * ) Notice: Subject to any disclaimer, the term of this patent is extended or adjusted under 35 U.S.C. 154(b) by 143 days.

(21) Appl. No.: 09/761,688

(22) Filed: Jan. 18, 2001

(65) Prior Publication Data
US 2001/0028276 A1 Oct. 11, 2001

(30) Foreign Application Priority Data
Mar. 22, 2000 (KR) .............................................. 00-14526

(51) Int. Cl.[7] .......................... H03L 7/089; H03L 7/095; H03L 7/099; H03B 5/24

(52) U.S. Cl. ............................. 331/10; 331/16; 331/17; 331/25; 331/57; 327/156; 327/157

(58) Field of Search ............................ 331/1 A, 10, 16, 331/17, 25, DIG. 2, 44, 57; 327/156–159; 377/376; 360/51; 455/260

(56) References Cited
U.S. PATENT DOCUMENTS
6,154,099 A * 11/2000 Suzuki et al. .................. 331/57
* cited by examiner Primary Examiner—David Mis

(57) ABSTRACT

Disclosed is a self-calibration device for calibrating a phase difference between output waveforms of a ring oscillator, comprising: a voltage-controlled oscillator adapted to adjust the transition time of an output signal according to an inputting of a control voltage for controlling the phase offset and generate the adjusted output signal; a divider adapted to divide a frequency of the output signal generated from the voltage-controlled oscillator by a fractional number to generate a plurality of output waveforms having different phases with them having an identical phase difference each other; a phase-locked loop (PLL) circuit adapted to correctly make a frequency and phase of the output signal of the divider coincident with those of a system clock, the phase-locked loop (PLL) circuit including at least a phase-frequency detecting means adapted to compare the frequency and phase of the output signal with those of the system clock and to output a result of the comparison; and a phase offset calibrating loop circuit adapted to generate a control voltage for detecting a phase offset between output waveforms of the voltage-controlled oscillator and controlling the detected phase offset according to the result of the comparison inputted thereto from the phase-frequency detecting means for application to the voltage-controlled oscillator.

8 Claims, 3 Drawing Sheets

SELF-CALIBRATION DEVICE AND METHOD FOR CALIBRATING PHASE OFFSET BETWEEN OUTPUT WAVEFORMS OF RING OSCILIATOR

BACKGROUND OF THE INVENTION

1. Field of the Invention

The present invention relates to a ring oscillator, and more particularly, a self-calibration circuit and method for calibrating phase offset between output waveforms of the ring oscillator.

2. Description of the Related Art

In general, for a mobile telecommunication system, since data is transmitted through two channels, i.e. an In-phase channel (I channel) and a Quadrature-phase channel (Q channel), both an In-phase (I) oscillating signal and a Quadrature-phase (Q) oscillating signal having a phase difference of 90 degrees each other are required to completely restore a desired signal. These oscillating signals are used as input signals of a down-converter for down-converting in frequency a signal received by a receiver to a baseband frequency at a receiving terminal of the receiver, and are used as input signals of a up-converter for up-converting the baseband signal to a signal of a higher frequency band at a transmitting terminal thereof. In the case where the In-phase oscillating signal and the Quadrature-phase oscillating signal do not have a correct 90 degrees phase, since a bit error rate is increased when restoring the desired signal lastly. Therefore, it is necessary that the I and Q oscillating signals having a correct phase difference each other be produced. Particularly, in the case of a direct conversion type receiver or an image rejection type receiver in which a signal is divided at a higher frequency through the two channels, i.e., the In-phase channel (I channel) and the Quadrature-phase channel (Q channel), an effect of an I-Q mismatch (i.e. a mismatch between the In-phase and the Quadrature-phase) is exhibited more seriously. For this reason, a correct operation of a transceiver always requires elimination of a phase error generated between the oscillating signals of the I and Q channels.

As a method of producing oscillating signals having a phase difference of 90 degrees each other, a method in which a phase shifter produces a signal having two phases by delaying an oscillating signal by a desired phase by using a resistor and a capacitor, and a method in which a quadrant generator with a master-slave construction produces oscillating signals having a phase difference of 90 degrees each other can be given. In the case of the former method employing the phase shifter, since there can occur a signal loss corresponding to a signal magnitude due to use of passive elements, an additional buffer circuit is generally required. Further, there still exists a problem of a mismatch between the I and Q oscillating signals due to a noise caused from the resistor, and a difference in the elements and signal paths.

Also, for the latter method for producing the I and Q oscillating signals, the quadrant generator with the master-slave construction is implemented by using two flip-flop circuits. In this case, an effect of a noise due to the passive elements is reduced, but an input signal having a frequency twice as large as frequencies of desired I and Q oscillating signals is necessary, which results in an increase of a required frequency of the oscillator. Also, in the case of employing the master-slave construction, when a duty cycle of the input signal does not become 50% precisely, there is generated a phase error between the I and Q oscillating signals. As a result, an additional circuit for matching the duty cycle of the input signal is needed.

However, in the case where a ring oscillator is employed to produce the I and Q oscillating signals of the transceiver, the I and Q oscillating signals having a phase difference of 90 degrees each other can be obtained easily even without using the phase shifter or the quadrant generator as mentioned above. The ring oscillator is a circuit designed to generate oscillation in such a fashion that a plurality of inverter circuits are basically connected to each other to compose a positive-feedback loop. Odd numbered stages are required to compose an oscillation feedback loop in a single-ended ring oscillator, but in a differential structured ring oscillator the oscillation feedback loop can be composed of even numbered stages.

In the ring oscillator, when the delay of a unit delay cell is Td, and the number of stages thereof is N, in the case where an even number of differential structured ring oscillators are used, since even numbered outputs are produced and two output signals having a phase difference of 180 degrees each other are generated from each delay cell, 2N output signals having a phase difference of 360 degrees/2N each other can be obtained. Accordingly, in case of implementing a ring oscillator with 2 stages, 4 stages, 8 stages, . . . , $2^N$ stages, I and Q oscillating signals having a phase difference of 90 degrees each other can be obtained directly from an output of the ring oscillator without constructing a separate circuit, and it is possible to directly employ the I and Q oscillating signals in the transceiver.

However, even in case of the ring oscillator, there exists a phase offset between output waveforms having different phases because of a mismatch between delay elements constituting each stage of the ring oscillator or a difference in signal paths. For this reason, a phase difference between adjoining waveforms will be deviated from a value of the phase difference of 360 degrees/2N gradually. FIG. 1 is an output waveform of a ring oscillator for explaining a state in which a phase offset due to a mismatch between output waveforms occurs, wherein FIG. 1(a) is an output waveform of the ring oscillator in which the mismatch does not exist, and FIG. 1(b) is an output waveform of the ring oscillator in which the mismatch exists. Accordingly, in order to obtain the I and Q oscillating signals having a correct phase difference each other from the ring oscillator, there is needed a device and method for calibrating a phase offset between output waveforms caused due to a mismatch between the delay cells or a difference in signal paths.

SUMMARY OF THE INVENTION

Therefore, the present invention has been made in view of the above-mentioned problems, and it is an object of the present invention to provide a self-calibration device and method for eliminating a phase offset between output waveforms caused due to a mismatch between respective delay cells constituting a ring oscillator or a difference between signal paths.

Another object of the present invention is to provide a self-calibration device and method for producing I and Q oscillating signals having a correct phase difference each other from an output of a ring oscillator.

In order to achieve the above objects, according to an aspect of the present invention there is provided a self-calibration device for calibrating a phase difference between output waveforms of a ring oscillator, comprising:

a voltage-controlled oscillator adapted to adjust the transition time of an output signal according to an inputting of a control voltage for controlling the phase offset and generate the adjusted output signal;

a divider adapted to divide a frequency of the output signal generated from the voltage-controlled oscillator by a fractional number to generate a plurality of output waveforms having different phases with them having an identical phase difference each other;

a phase-locked loop (PLL) circuit adapted to correctly make a frequency and phase of the frequency-divided output signal generated from the divider coincident with those of a system clock, the phase-locked loop (PLL) circuit including at least a phase-frequency detecting means adapted to compare the frequency and phase of the frequency-divided output signal with those of the system clock and to output a result of the comparison; and a phase offset calibrating loop circuit adapted to generate a control voltage for detecting a phase offset between output waveforms of the voltage-controlled oscillator and controlling the detected phase offset according to the result of the comparison inputted thereto from the phase-frequency detecting means for application to the voltage-controlled oscillator.

According to another aspect of the present invention there is also provided a method of calibrating a phase difference between output waveforms of a ring oscillator in a system including the ring oscillator, a divider adapted to divide a frequency of the output signal generated from the ring oscillator by a fractional number to generate a plurality of output waveforms having different phases with them having an identical phase difference each other, and a phase-locked loop (PLL) circuit adapted to correctly make a frequency and phase of the frequency-divided output signal coincident with those of a system clock, the phase-locked loop (PLL) circuit including at least a phase-frequency detecting means adapted to compare the frequency and phase of the frequency-divided output signal with those of the system clock and to output a result of the comparison, comprising the steps of:

determining whether or not the frequency-divided output signal generated from the divider and the system clock are locked;

detecting a phase offset of each of the delay cells constituting the ring oscillator according to the result of the comparison generated from the phase-frequency detecting means if it determined that the frequency-divided output signal and the system clock are locked; and generating a control voltage for calibrating the detected phase offset to apply the generated control voltage to the ring oscillator so as to sequentially calibrate the phase offset for each of the delay cells.

BRIEF DESCRIPTION OF THE DRAWINGS

The foregoing and other objects, features and advantages of the present invention will become more apparent from the following detailed description when taken in conjunction with the accompanying drawings in which:

FIG. 1 is an output waveform of a ring oscillator for explaining a state in which a phase offset due to a mismatch between output waveforms occurs, wherein FIG. 1(a) is an output waveform of the ring oscillator in which the mismatch does not exist, and FIG. 1(b) is an output waveform of the ring oscillator in which the mismatch exists;

DETAILED DESCRIPTION OF THE PREFERRED EMBODIMENT

Reference will now be made in detail to a self-calibration device and method for calibrating phase offset between output waveforms of a ring oscillator according to a preferred embodiment of the present invention. In the following description of the present invention, numerous specific details, such as circuit constituting elements, for example, a voltage-controlled oscillator composed of 4-stage differential delay cells for outputting 8 waveforms concrete, are set forth to provide a more thorough understanding of the present invention. It will be apparent, however, to those skilled in the art that the invention may be practiced otherwise than according to the previously mentioned specific details. The detailed description of known functions and configurations incorporated herein will be omitted when it may make the subject matter of the present invention rather unclear.

Figure 2:
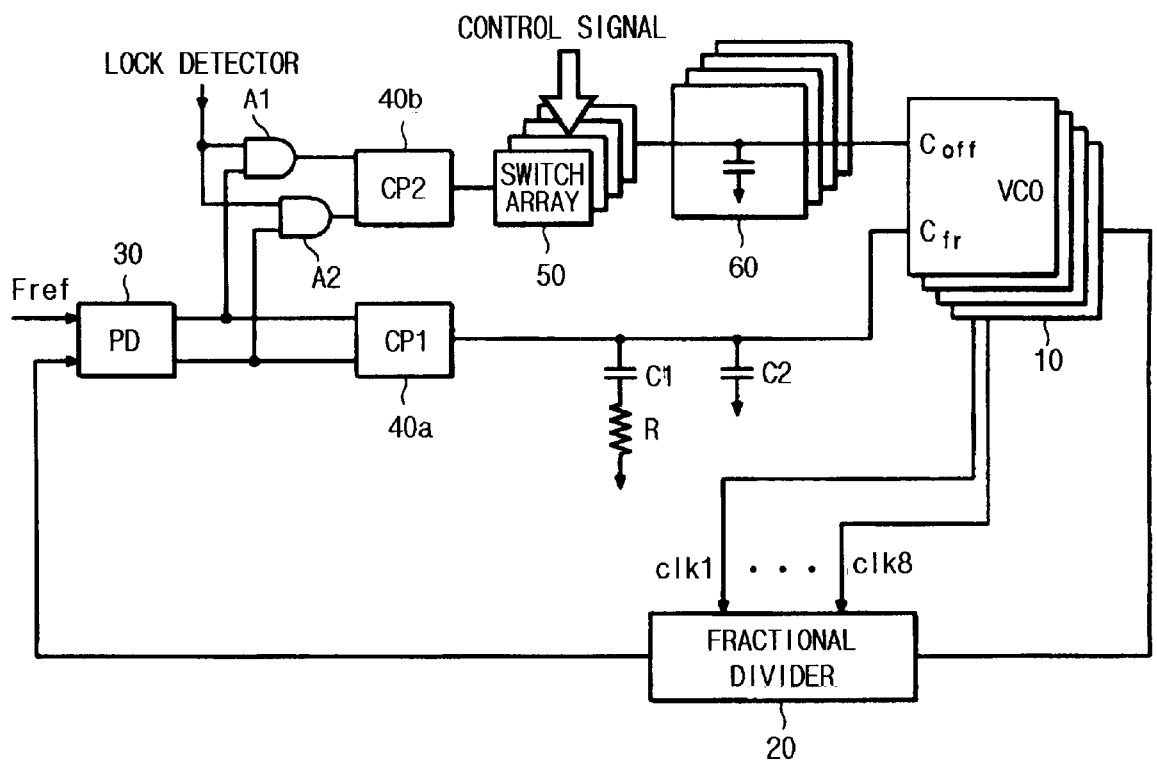
FIG. 2 is a circuit block diagram illustrating the construction of a self-calibration device which combines a phase-locked loop (PLL) circuit and a phase offset calibrating loop circuit according to a preferred embodiment of the present invention.

FIG. 2 is a circuit block diagram illustrating the construction of a self-calibration device which combines a phase-locked loop (PLL) circuit and a phase offset calibrating loop circuit according to a preferred embodiment of the present invention, wherein portions represented by a solid line in the drawing denote the phase offset calibrating loop circuit and the remaining portions denote the phase-locked loop (PLL) circuit.

Referring to FIG. 2, the self-calibration device according to a preferred embodiment of the present invention includes a voltage-controlled oscillator 10, a fractional divider 20, a phase-locked loop (PLL) circuit, and a phase offset calibrating loop circuit. The phase offset calibrating loop circuit is composed of a charge pump circuit (CP2) 40b, a capacitor array 60, a switch array 50, and AND gate elements A1 and A2. The charge pump circuit (CP2) 40b is adapted to output a constant current undergoing a sink or a sourcing according to a result of comparison inputted thereto from a phase-frequency detector (PD) 30 which will be described later. The capacitor array 60 is adapted to apply a voltage increased or decreased in response to the constant current inputted thereto from the charge pump circuit (CP2) 40b as a phase offset control voltage to a phase offset control terminal $C_{off}$ of a voltage-controlled oscillator (VCO) 10. A switch array 50 is adapted to interceptively control the constant current and is sandwiched between the charge pump circuit 40b and the capacitor array 60 to be connected with the charge pump circuit 40b and the capacitor array 60 each other. The voltage-controlled oscillator 10 is a ring type voltage-controlled oscillator in which a plurality of stages of self-calibrating delay cells are cascade-connected to each other for adjusting the transition time of an output signal by means of a control voltage for controlling a phase offset between output waveforms of the voltage-controlled oscillator caused due to a mismatch. The delay cells act to adjust the delay time and the transition time of each delay cell through the adjustment of a frequency control voltage and a phase offset control voltage. The fractional divider 20 is a frequency divider which divides a frequency of a signal inputted to an input thereof from the voltage-controlled oscillator (VCO) 10 by a fractional number to generate a plurality of output waveforms having different phases with them having an identical phase difference of a multiple of a fractional number (⅛) of a period of an output signal from the voltage-controlled oscillator (VCO) 10 each other. The AND gate elements A1 and A2 which are connected to an input terminal of the charge pump circuit 40b is adapted to act to apply an output of the phase-frequency detector (PD) 30 to the phase offset calibrating loop circuit only when a phase-locked loop (PLL) circuit which will be described later has been locked completely. A signal applied to an input terminal of the AND gate elements A1 and A2 is a signal having a logic level of "1" only when the phase-locked loop (PLL) circuit has been locked. The signal having a logic level of "1" is applied to the AND gate elements A1 and A2 from a separate lock detector or digital logic circuit in such a fashion that the signal is inputted periodically to the input terminal of the AND gate elements A1 and A2 with it having a period greater than a locked time of the phase-locked loop (PLL) circuit. In the meantime, the calibration of a phase offset of each delay cell of the ring type voltage-controlled oscillator requires both recognition of that one of inputs of the phase-frequency detector (PD) 30, i.e. an output edge of a minority divider 20 has been locked with an output of which delay cell and adjustment of the transition time of a delay cell corresponding to the phase error. For this purpose, in the present invention, an update of an voltage of the capacitor array 60 for storing the phase offset control voltage must be performed in proper order. At this time, a signal for setting a proper order of the update is a control signal for controlling a switching of the capacitor array 60. Since such a control signal has a characteristic that it is repeated periodically, it may be produced by a separate digital logic circuit of an FSM (Finite State Machine) type.

The phase offset calibrating loop circuit having the above-mentioned construction controls the phase offset control voltage of the self-calibrating delay cells of the ring type voltage-controlled oscillator in response to the increased or decreased control voltage outputted from the capacitor array 60, thereby eliminating a phase offset between output waveforms of the ring type voltage-controlled oscillator caused due to a mismatch between respective delay cells.

In the meantime, in order to correctly detect the phase offset due to the mismatch, since a frequency and phase of an output signal of a minority divider in a phase-locked loop (PLL) and those of a system clock must be maintained in a state in which the frequency and phase of the output are coincident with those of the system clock during the detection of a phase error by the phase-frequency detector 30, a separate phase-locked loop (PLL) circuit besides the above phase offset calibrating loop circuit is needed. Such a phase-locked loop (PLL) circuit is a circuit designed to correctly make the frequency and phase of the output signal frequency-divided by the divider coincident with those of the system clock. As shown in FIG. 2, the phase-locked loop (PLL) circuit includes a phase-frequency detector 30, a charge pump circuit (CP1) 40a, and a low pass filter R, C1, C2. The phase-frequency detector 30 is adapted to compare the frequency and phase of the output signal frequency-divided by the divider with those of the system clock and to output a result of the comparison. The charge pump circuit (CP1) 40a is adapted to output a constant current undergoing a sink or a sourcing according to the result of the comparison inputted thereto from the phase-frequency detector (PD) 30. And, the low pass filter R, C1, C2 is adapted to apply a voltage increased or decreased in response to the constant current inputted thereto from the charge pump circuit (CP1) 40a as a frequency control voltage to a frequency control terminal $C_{fr}$ of a voltage-controlled oscillator (VCO) 10. The increased or decreased control voltage produced from the low pass filter R, C1, C2 adjusts a frequency control voltage of the delay cells constituting the voltage-controlled oscillator 10 so that the phase-locked loop (PLL) is locked to make the frequency and phase of the output signal frequency-divided by the divider 20 coincident with those of the system clock.

Accordingly, the self-calibration device for calibrating a phase offset between output waveforms of the ring oscillator includes the phase-locked loop (PLL) circuit for locking the output signal of the minority divider 20 and the system clock, and the phase offset calibrating loop circuit for detecting a phase offset between output waveforms of the ring oscillator caused due to a mismatch in a state in which the output signal of the minority divider 20 and the system clock are locked, to eliminate a phase offset of each delay cells of the voltage-controlled oscillator 10.

An operation of the self-calibration device of the present invention having the above construction will now be described hereinafter in detail with reference to FIGS. 3 to 6.

Figure 3:
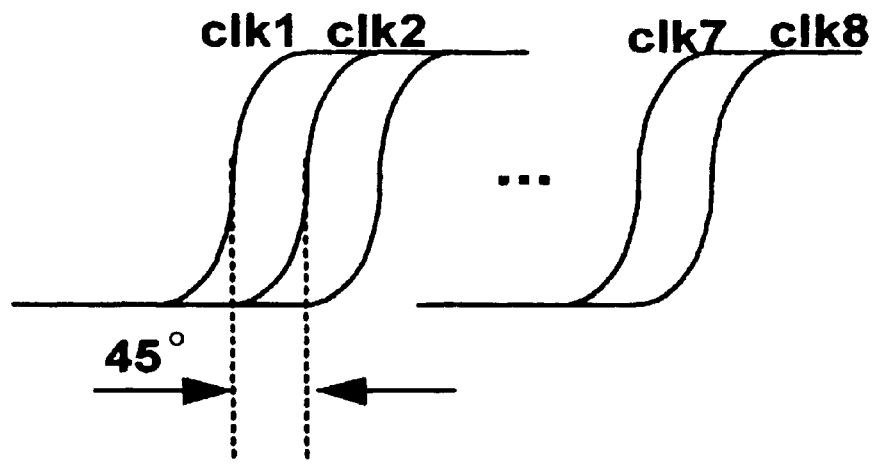
FIG. 3 is an output waveform of a voltage-controlled oscillator as a ring oscillator.

FIG. 3 is an output waveform of a voltage-controlled oscillator 10 as a ring oscillator.

Figure 1:
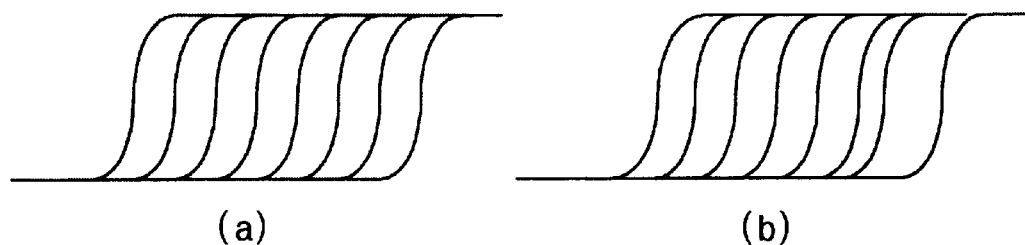

Referring to FIG. 3, the output waveforms clk1, . . . , clk8 of the voltage-controlled oscillator 10 have eight different phases, and ideally, the output waveforms are arranged to be spaced apart in a certain interval of 45 degrees from each other, but practically, the output waveforms have a phase difference deviated from a phase difference of 45 degrees due to a mismatch between delay elements constituting the delay cell or a difference in signal paths as shown in FIG. 1(*b*). Accordingly, in case of using the I and Q oscillating signals having a phase difference of 90 degrees each other extracted among the output waveforms involving a generation of errors in a phase difference, there occurs a mismatch between the I and Q oscillating signals.

Figure 4:
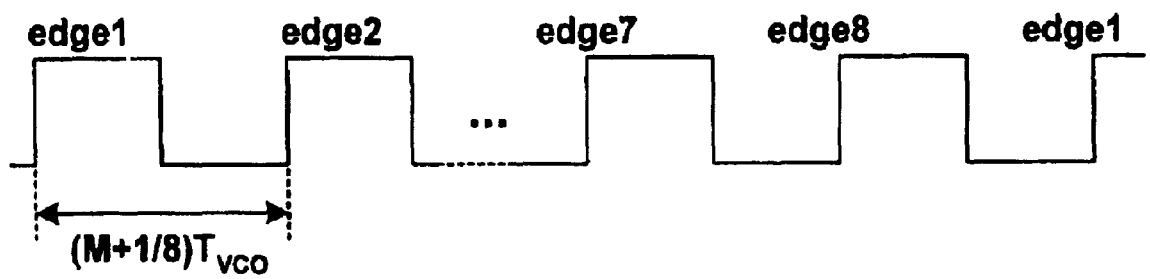
FIG. 4 is an output waveform of a minority divider shown in FIG. 2.

FIG. 4 is an output waveform of a minority divider 20 shown in FIG. 2 designed to detect a phase offset between output waveforms caused due to a mismatch.

Referring to FIG. 4, each edge of the output waveform of the minority divider 20 is locked with eight output waveforms of the voltage-controlled oscillator 10 alternately. Accordingly, a ratio of division in frequency, i.e., a divider ratio is an integer value (M)+⅛, and each cycle of the output signal frequency-divided by the divider 20 includes a phase offset of the voltage-controlled oscillator 10. The waveform of the frequency-divided output signal produced in the above manner becomes an input signal of the phase-frequency detector (PD) 30 which is locked with a reference system clock Fref by the phase-locked loop (PLL) circuit. In a state in which the frequency-divided output signal and the reference system clock Fref are locked with each other, a phase offset between the output waveforms caused due to a mismatch between the delay cells generates a phase error in an output signal of the phase-frequency detector (PD) 30.

Figure 5:
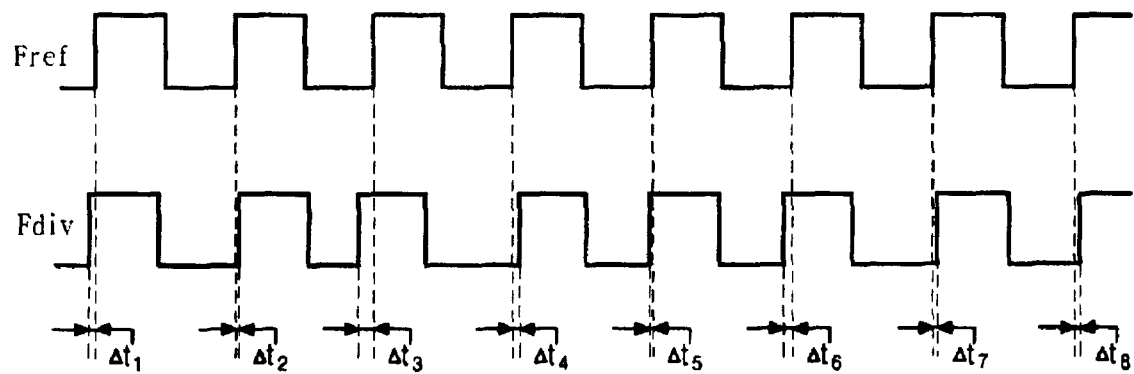
FIG. 5 is output waveforms of a system clock and an output signal from a divider which are inputted to a phase-frequency detector in a phase-locked loop (PLL) circuit shown in FIG. 2 in a state in which the system clock and the output signal are locked.

FIG. 5 is output waveforms of the system clock and the output signal of the divider which are inputted to the phase-frequency detector (PD) 30 in the phase-locked loop (PLL) circuit shown in FIG. 2 in a state in which the system clock and the output signal are locked.

Referring to FIG. 5, a phase error represented in each cycle of a waveform of the output signal of the phase-frequency detector (PD) 30 is proportional to a phase offset of a corresponding delay cell. That is, $\Delta t_i$ denotes an amount of a phase error generated by a phase offset of i-th delay cell of the voltage-controlled oscillator 10. When the frequency-divided output signal of the divider and the reference system clock Fref are locked with each other, since the phase-locked loop (PLL) circuit is operated so that a mean phase error detected by the phase-frequency detector (PD) 30 becomes 0, the total amount of a phase error generated by a phase offset of each delay cell becomes 0. Accordingly, an [Equation 1] can be written as follows:

$$\Delta t_1 + \Delta t_2 + \Lambda + \Delta t_8 = 0 \qquad \text{[Equation 1]}$$

When it is assumed that a phase offset of 1st delay cell of the voltage-controlled oscillator 10 is reduced by $\Delta_1^1$ through once operation of the self-calibration device, if the frequency-divided output signal of the divider and the reference system clock Fref are locked with each other again after the calibration of the phase offset, an amount of a phase error for each delay cell will be varied like in an [Equation 2].

$$\Delta t_1^1 = \Delta t_1 - \Delta_1^1 + \frac{\Delta_1^1}{8}, \qquad \text{[Equation 2]}$$

$$\Delta t_2^1 = \Delta t_2 + \frac{\Delta_1^1}{8}, \Lambda, \Delta t_8^1 = \Delta t_8 + \frac{\Delta_1^1}{8}$$

In [Equation 2], $\Delta t_N^k$ denotes an amount of a phase error caused due to a phase offset of N-th delay cell of the voltage-controlled oscillator 10 after the self-calibration of K-cycle, and $\Delta_N^m$ denotes a calibrated amount of a phase error when the self-calibration of the phase offset is repeated m times for each delay cell. Like this, when the self-calibration process is performed repeatedly, the phase offset will be varied as follows:

Step 1

$$\Delta t_1, \Delta t_2, \Delta_3, \ldots, \Delta t_N$$

Step 2

$$\Delta t_1 - \Delta_1^1 + \frac{\Delta_1^1}{N}, \quad \Delta t_2 + \frac{\Delta_1^1}{N}, \quad \Delta t_3 + \frac{\Delta_1^1}{N}, \ldots, \Delta t_N + \frac{\Delta_1^1}{N}$$

Step 3

$$\Delta t_1 - \Delta_1^1 + \frac{\Delta_1^1}{N} + \frac{\Delta_2^1}{N}, \qquad \Delta t_2 - \Delta_2^1 + \frac{\Delta_1^1}{N} + \frac{\Delta_2^1}{N},$$

$$\Delta t_3 + \frac{\Delta_1^1}{N} + \frac{\Delta_2^1}{N}, \ldots, \qquad \Delta t_N + \frac{\Delta_1^1}{N} + \frac{\Delta_2^1}{N}.$$

Step N $$\Delta t_1 - \Delta_1^1 + \frac{1}{N}\sum_{k=1}^{N}\Delta_k^1, \quad \Delta t_2 - \Delta_2^1 + \frac{1}{N}\sum_{k=1}^{N}\Delta_k^1,$$

$$\Delta t_3 - \Delta_3^1 + \frac{1}{N}\sum_{k=1}^{N}\Delta_k^1, \ldots, \quad \Delta t_N - \Delta_N^1 + \frac{1}{N}\sum_{k=1}^{N}\Delta_k^1$$

In the case where the self-calibration of the phase error continues to be performed repeatedly for each delay cell alternately, when the total sum of the calibrated amount of the phase error is equal to an initial value of each phase offset for all the delay cells, that is, $Q(\Delta_N^m) - \Delta_N^t$ is satisfied, an amount of a final phase error for 1st delay cell can be written like [Equation 3].

$$\Delta t_1^{fina} = \Delta t_1 - \sum_{k=1}^{\infty}\Delta_1^k + \frac{1}{8}\left(\sum_{k=1}^{\infty}\Delta_1^k + \sum_{k=1}^{\infty}\Delta_2^k + \Lambda + \sum_{k=1}^{\infty}\Delta_s^k\right) \qquad \text{[Equation 3]}$$

$$= \Delta t_1 - \Delta t_1 + \frac{1}{8}\sum_{n=1}^{s}\Delta t_N = 0$$

Similarly, an amount of phase errors caused due to phase offsets of all the delay cells of the voltage-controlled oscillator 10 becomes 0. Accordingly, all the phase offsets between output waveforms produced from each delay cell are eliminated. That is, a relationship such as [Equation 4] is obtained.

$$\Delta t_1^{final} = \Delta t_2^{final} = \Delta t^{final} = \ldots = \Delta t_8^{final} = 0 \qquad \text{[Equation 4]}$$

Figure 6:
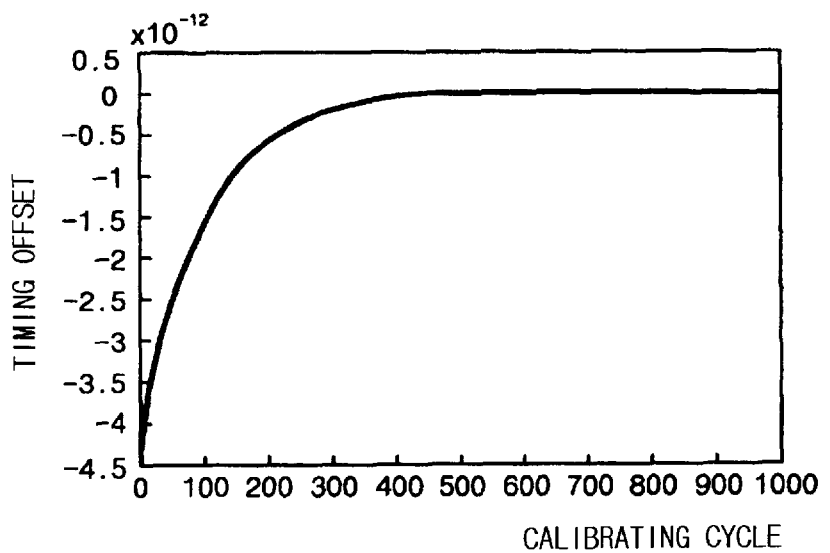
FIG. 6 is a graph illustrating a relationship between a timing offset and a calibration cycle according to elimination of a phase offset by a self-calibration device according to a preferred embodiment of the present invention.

FIG. 6 is a graph illustrating a relationship between a timing offset and a calibration cycle according to elimination of a phase offset by a self-calibration device according to a preferred embodiment of the present invention.

Referring to FIG. 6, there is shown a variation of $\Delta t_2^1$ through a simulation of a phase offset calibrating algorithm. It can be seen from FIG. 6 that a phase offset converges toward 0 after an elapse of a constant cycle.

As described above, in order for a phase difference between the output signal of the minority divider 20 and a reference waveform to correctly include only a phase offset caused due to a mismatch, since the phase-locked loop (PLL) circuit must be locked completely, an update of the phase offset control voltage of the phase offset calibrating loop circuit must be performed in a cycle much longer than the locking time of the phase-locked loop (PLL) circuit, and simultaneously, a current phase offset control voltage must be maintained until an update of the next signal. An update interval of the phase offset control voltage can be adjusted through the control of an on/off interval of the switch 50 included in the phase offset calibrating loop circuit, and the phase offset control voltage is maintained by the capacitor array 60 connected to the phase offset control terminal $C_{off}$ of each delay cell of the voltage-controlled oscillator 10.

Accordingly, the present invention eliminates a phase offset between output waveforms of the ring oscillator caused due to a mismatch by using the phase offset calibrating loop circuit while the output signal of the minority divider 20 and the system clock Fref are locked with each other by using the phase-locked loop (PLL) circuit.

As can be seen from the foregoing, according to present invention, the use of the self-calibration device enables calibration of a phase offset between output waveforms of the ring oscillator so that the I and Q oscillating signals having a correct phase difference each other can be produced easily from an output signal of the ring oscillator, thereby improving a degree of integration and performance of transceiver requiring a correct I-Q match (i.e. a correct match between the In-phase and the Quadrature-phase) such as a direct conversion type receiver, etc. Further, the present invention makes a phase difference between output waveforms of the ring oscillator constant so that it can be applied widely to diverse application fields utilizing a multiphase output of the ring oscillator, as well as eliminates a necessity of a separate circuit for producing the I and Q oscillating signals so that a power consumption and an area of a chip are reduced and a deterioration of a noise characteristic can be prevented.

While this invention has been described in connection with what is presently considered to be the most practical and preferred embodiment, it is to be understood that the invention is not limited to the disclosed embodiment, but, on the contrary, it is intended to cover various modifications within the spirit and scope of the appended claims.

What is claimed is:

1. A self-calibration device for calibrating a phase difference between output waveforms of a ring oscillator, comprising:

a voltage-controlled oscillator adapted to adjust the transition time of an output signal according to an inputting of a control voltage for controlling the phase offset and generate the adjusted output signal;

a divider adapted to divide a frequency of the output signal generated from the voltage-controlled oscillator by a fractional number to generate a plurality of output waveforms having different phases with them having an identical phase difference each other;

a phase-locked loop (PLL) circuit adapted to correctly make a frequency and phase of the frequency-divided output signal generated from the divider coincident with those of a system clock, the phase-locked loop (PLL) circuit including at least a phase-frequency detecting means adapted to compare the frequency and phase of the frequency-divided output signal with those of the system clock and to output a result of the comparison; and a phase offset calibrating loop circuit adapted to generate a control voltage for detecting a phase offset between output waveforms of the voltage-controlled oscillator and controlling the detected phase offset according to the result of the comparison inputted thereto from the phase-frequency detecting means for application to the voltage-controlled oscillator.

2. The self-calibration device according to claim 1, wherein the phase offset calibrating loop circuit comprises:

a charge pumping means adapted to output a constant current undergoing a sink or a sourcing according to the result of the comparison inputted thereto from the phase-frequency detecting means;

a capacitor array adapted to apply a voltage increased or decreased in response to the constant current inputted thereto from the charge pumping means as a phase offset control voltage to the voltage-controlled oscillator; and a switch array adapted to interceptively control the constant current, the switch being sandwiched between the charge pumping means and the capacitor array to be connected with the charge pumping means and the capacitor array each other.

3. The self-calibration device according to claim 2 further comprising at least two AND gate elements adapted to apply a signal of a "high" level to the charge pumping means only when the phase-locked loop (PLL) circuit has been locked.

4. The self-calibration device according to claim 3, wherein the phase-locked loop (PLL) circuit further comprises:

a charge pumping means adapted to output a constant current undergoing a sink or a sourcing according to the result of the comparison inputted thereto from the phase-frequency detector; and a low pass filter adapted to apply a voltage increased or decreased in response to the constant current inputted thereto from the charge pumping means as a frequency control voltage to the voltage-controlled oscillator.

5. The self-calibration device according to any one of claims 1 to 4, wherein the phase offset calibrating loop circuit is operated normally in a state in which the frequency-divided output signal generated from the divider and the system clock are locked.

6. A method of calibrating a phase difference between output waveforms of a ring oscillator in a system including the ring oscillator, a divider adapted to divide a frequency of the output signal generated from the voltage-controlled oscillator by a fractional number to generate a plurality of output waveforms having different phases with them having an identical phase difference each other, and a phase-locked loop (PLL) circuit adapted to correctly make a frequency and phase of the frequency-divided output signal coincident with those of a system clock, the phase-locked loop (PLL) circuit including at least a phase-frequency detecting means adapted to compare the frequency and phase of the frequency-divided output signal with those of the system clock and to output a result of the comparison, comprising the steps of:

determining whether or not the frequency-divided output signal generated from the divider and the system clock are locked;

detecting a phase offset of each of the delay cells constituting the ring oscillator according to the result of the comparison generated from the phase-frequency detecting means if it determined that the frequency-divided output signal and the system clock are locked; and generating a control voltage for controlling the detected phase offset to apply the generated control voltage to the ring oscillator so as to sequentially calibrate the phase offset for each of the delay cells.

7. The method according to claim 6, wherein an update of the control voltage for controlling the phase offset is performed in a cycle much longer than the locking time of the phase-locked loop (PLL) circuit while a current phase offset control voltage must be maintained until an update of the next signal.

8. The method according to claim 7, wherein the control voltage for controlling the phase offset is maintained by a capacitor array connected to a phase offset control terminal of the ring oscillator, and an update interval of the phase offset control voltage is adjusted through the control of an interval during which a constant current generated after undergoing a sink or a sourcing according to the result of the comparison generated from the phase-frequency detecting means is supplied to the capacitor array.

* * * * *